(12) United States Patent
Goodwin et al.

(10) Patent No.: US 7,305,595 B2
(45) Date of Patent: Dec. 4, 2007

(54) METHOD, SYSTEM, AND PRODUCT FOR ISOLATING MEMORY SYSTEM DEFECTS TO A PARTICULAR MEMORY SYSTEM COMPONENT

(75) Inventors: Joel Gerard Goodwin, Austin, TX (US); Manish Misra, Karnataka (IN); John Daniel Upton, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 869 days.

(21) Appl. No.: 10/660,006

(22) Filed: Sep. 11, 2003

(65) Prior Publication Data

US 2005/0060604 A1    Mar. 17, 2005

(51) Int. Cl.
*G11C 29/00* (2006.01)
*G06F 11/00* (2006.01)
(52) U.S. Cl. .......................... 714/718; 714/30
(58) Field of Classification Search ............. None
See application file for complete search history.

(56) References Cited

U.S. PATENT DOCUMENTS 5,343,478 A  *   8/1994   James et al. ............... 714/726
5,357,521 A       10/1994  Cheng et al. .............. 371/21.3
5,357,621 A  *  10/1994   Cox .............................. 711/172

* cited by examiner

*Primary Examiner*—Cynthia Britt
*Assistant Examiner*—John J. Tabone, Jr.
(74) *Attorney, Agent, or Firm*—Duke W. Yee; Diana R. Gerhardt; Lisa B. Yociss (57) ABSTRACT

A method, system, and product are disclosed for isolating a defect in a memory system by determining in which particular component of the memory system the defect exists. The memory system includes multiple components. The components include a physical memory module, a memory card to which the physical memory module is attached, and a memory controller for controlling the memory card. The memory card includes one or more electrical buffers for driving or detecting the memory signals. The buffers may be used as virtual memory elements. Each component is tested separately in order to identify the defective component with the help of virtual memory system elements. The components are tested by first testing the physical memory module. If the physical memory module passes the test, the memory card is then tested. If the memory card passes its test, the memory controller is tested.

8 Claims, 5 Drawing Sheets

METHOD, SYSTEM, AND PRODUCT FOR ISOLATING MEMORY SYSTEM DEFECTS TO A PARTICULAR MEMORY SYSTEM COMPONENT

BACKGROUND OF THE INVENTION

1. Technical Field

The present invention relates generally to the field of data processing systems, and more specifically to a method, system, and computer program product for testing a memory system. Still more particularly, the present invention relates to a method, system, and computer program product for isolating a defect in a memory system by determining in which particular component of the memory system the defect exists.

2. Description of Related Art

Currently, in a minimum system configuration with a single memory extent, there is no reliable method in computer memory fault isolation techniques to isolate a hardware problem among a memory module, such as a dual inline memory module (DIMM), a memory controller, and a memory card, which is the device to which memory modules are attached. The known methods test all parts of the memory system coupled together. With all parts of the memory system coupled together, patterns of data are written using the data and address bits to the memory subsystem using the memory controller. Data is then read back from the memory subsystem using the memory controller. First the memory controller is tested. The logic around memory controller is then tested. The logic for memory card is tested next, and finally memory modules are tested. The pattern written to the memory system is then compared to the pattern read back from the memory system. If the patterns do not match, then it is determined that a defect exists within the memory system. However, all components of memory systems are tested as one single unit and cannot be tested individually. In addition to that, in the minimum configuration, when only one of each memory system component, such as memory controller, memory card, and memory module is present, any detected error may reside in any one of the interconnected elements and cannot be isolated.

This prior art method for determining if a defect exists in the memory system cannot test various components of memory system individually because the three components, the memory controller, memory card, and memory modules, are all tested together as a coupled unit. Further, in the case of the minimum configuration, the prior art method makes it difficult to identify exact which component is defective. Further to that, the prior art method also does not elaborately test the memory card component of memory system and the logic around it. As a result, in the case of a defective memory card component, the problem cannot be isolated to the defective memory component and may increase the number of field replacement units in order to correct the memory system errors.

Therefore, a need exists for a method, system, and product for isolating a defect in a memory system by determining in which particular component of the memory system the defect exists regardless of the system configuration and also provide the ability to test various memory system components individually without having a dependency among each other.

SUMMARY OF THE INVENTION

A method, system, and product are disclosed for isolating a defect in a memory system by determining in which particular component of the memory system the defect exists. The memory system includes multiple components. The components include one or more physical memory module, one or more memory card to which physical memory modules are attached, and one or more memory controller for controlling the memory card. The memory card includes one or more electrical buffers for driving or detecting the memory signals. The buffers may be used as virtual memory system elements in accordance with the method described in this invention. Each memory component is tested separately in order to identify the defective component. The memory system is tested by first testing the physical memory modules using the electrical buffers as a virtual memory controller. If the physical memory modules pass the test, the memory card is then tested using the electrical buffers acting as virtual memory modules. If the memory card passes its test, the memory controller is tested using any of the prior art methods. In this manner, a defect may be isolated to a physical memory module, the memory card, or the memory controller.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A preferred embodiment of the present invention and its advantages are better understood by referring to the figures, like numerals being used for like and corresponding parts of the accompanying figures.

The present invention is a method, system, and computer program product for isolating a defect in a memory system by determining in which component of the memory system the defect exists, regardless of the system configuration, by testing each memory system component individually. The present invention reduces the number of field replacement units that must be carried by service persons by isolating a defect to a specific component of the memory system. In this manner, prior to calling a service person, the defective component is identified. Therefore, when a defect occurs, a call may be made to the service person, and the call may include an identification of the particular component of the memory system that is defective and that needs to be replaced. Thus, the defective device is identified prior to making a service call.

The present invention isolates defects to a particular component by testing each memory system component individually in a particular order. First, the physical memory modules are tested. Next, the memory card and then the memory controller are tested.

First, the physical memory modules attached to the memory card themselves are tested. A test pattern is setup to test the physical memory modules. A memory card typically includes electrical buffers as part of the card. According to the present invention, while testing physical memory modules attached to a memory card, these electrical buffers of the memory card act as a virtual memory controller. These buffers are coupled to a processor, such as a service processor, utilizing a bus, such as a JTAG bus. A test pattern is written to and then read back from the physical memory modules utilizing the buffers as a virtual memory controller over the JTAG bus by the service processor. In this way, the physical memory modules (physical DIMMs) of the memory system are tested. If no error is located in any of the physical memory modules, the present invention describes testing the memory card next.

As described, memory cards typically include electrical buffers as part of the card. According to the present invention, these buffers are treated as virtual memory modules in order to test the memory card. These buffers are coupled to a processor, such as a service processor, utilizing a bus, such as a JTAG bus. Each buffer is then assigned a unique identifier so that the buffer may be addressed by the service processor. Each buffer is then treated by the service processor as a virtual memory module and a test is executed for the memory card and the logic associated with the memory card. The system processor writes a test pattern to these electrical buffers. The service processor tests the data bits by reading data patterns to a single memory location falling within the range of the electrical buffer which is being treated as a virtual memory module. If the pattern that is read back matches the pattern that was written for each memory location in a virtual memory module, address bit verification is performed for the memory card.

Address bit verification is more complex than data bit verification. To test address bits, the memory locations in an electrical buffer which is being treated as a virtual memory module are cleared to a known state, such as all zeros. Next, a known data pattern is written to a specific memory location that falls within the range of a specified buffer or virtual memory module. Then a specific set of addresses falling with the range of the same electrical buffer or virtual memory module is read from to determine if the known data pattern is read back from memory locations other than the first specific memory location. If the known data pattern is read back from only the first specific memory location and no other locations, the service processor determines that the memory card passed the test. If the memory card passes this test, the known data pattern is removed from the first specific memory location and then written to a next specific memory location. This process is repeated until all of the memory address bits are verified.

The service processor tests the memory card using the buffers as virtual memory modules. Thus, the data and address tests described above are executed using the buffers to store the data patterns. When no error was detected in the physical memory modules testing, if an error occurs during the test of memory card using the buffers as virtual memory modules, it is determined that the memory card is defective and isolated.

If no errors occur during the test of the memory card using the buffers as virtual memory modules, then at this time, the physical memory modules and memory card are determined not to be defective. Next, the memory controller and support logic are tested using prior art methods such as Built In Self Test (BIST) or JTAG scan chain signature verification. If an error is found in this phase, the memory controller is identified as being defective. If no errors were detected in the memory controller test then the memory system is declared to be good.

Figure 1:
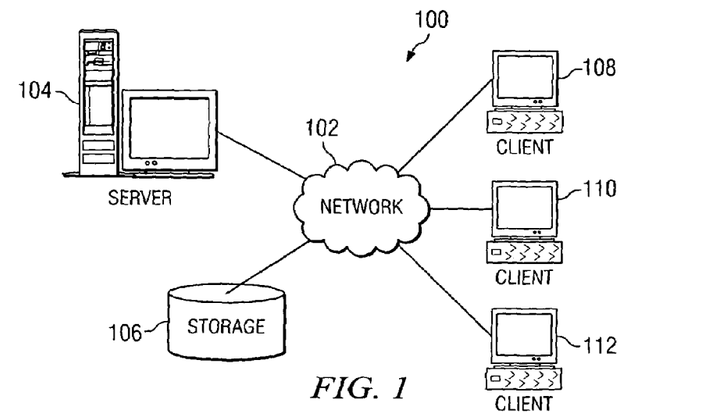
FIG. 1 depicts a pictorial representation of a network of data processing systems in which the present invention may be implemented in accordance with the present invention.

FIG. 1 depicts a pictorial representation of a network 100 of data processing systems in which the present invention may be implemented. Network data processing system 100 contains a network 102, which is the medium used to provide communications links between various devices and computers connected together within network data processing system 100. Network 102 may include connections, such as wire, wireless communication links, or fiber optic cables.

In the depicted example, a server 104 is connected to network 102 along with storage unit 106. In addition, clients 108, 110, and 112 also are connected to network 102 through a network communications device. Network 102 may include permanent connections, such as wire or fiber optic cables, or temporary connections made through telephone connections. The communications network 102 also can include other public and/or private wide area networks, local area networks, wireless networks, data communication networks or connections, intranets, routers, satellite links, microwave links, cellular or telephone networks, radio links, fiber optic transmission lines, ISDN lines, T1 lines, DSL, etc. In some embodiments, a user device may be connected directly to a server 104 without departing from the scope of the present invention. Moreover, as used herein, communications include those enabled by wired or wireless technology.

Clients 108, 110, and 112 may be, for example, personal computers, portable computers, mobile or fixed user stations, workstations, network terminals or servers, cellular telephones, kiosks, dumb terminals, personal digital assistants, two-way pagers, smart phones, information appliances, or network computers. For purposes of this application, a network computer is any computer, coupled to a network, which receives a program or other application from another computer coupled to the network.

In the depicted example, server 104 provides data, such as boot files, operating system images, and applications to clients 108-112. Clients 108, 110, and 112 are clients to server 104. Network data processing system 100 may include additional servers, clients, and other devices not shown. FIG. 1 is intended as an example, and not as an architectural limitation for the present invention.

Figure 2:
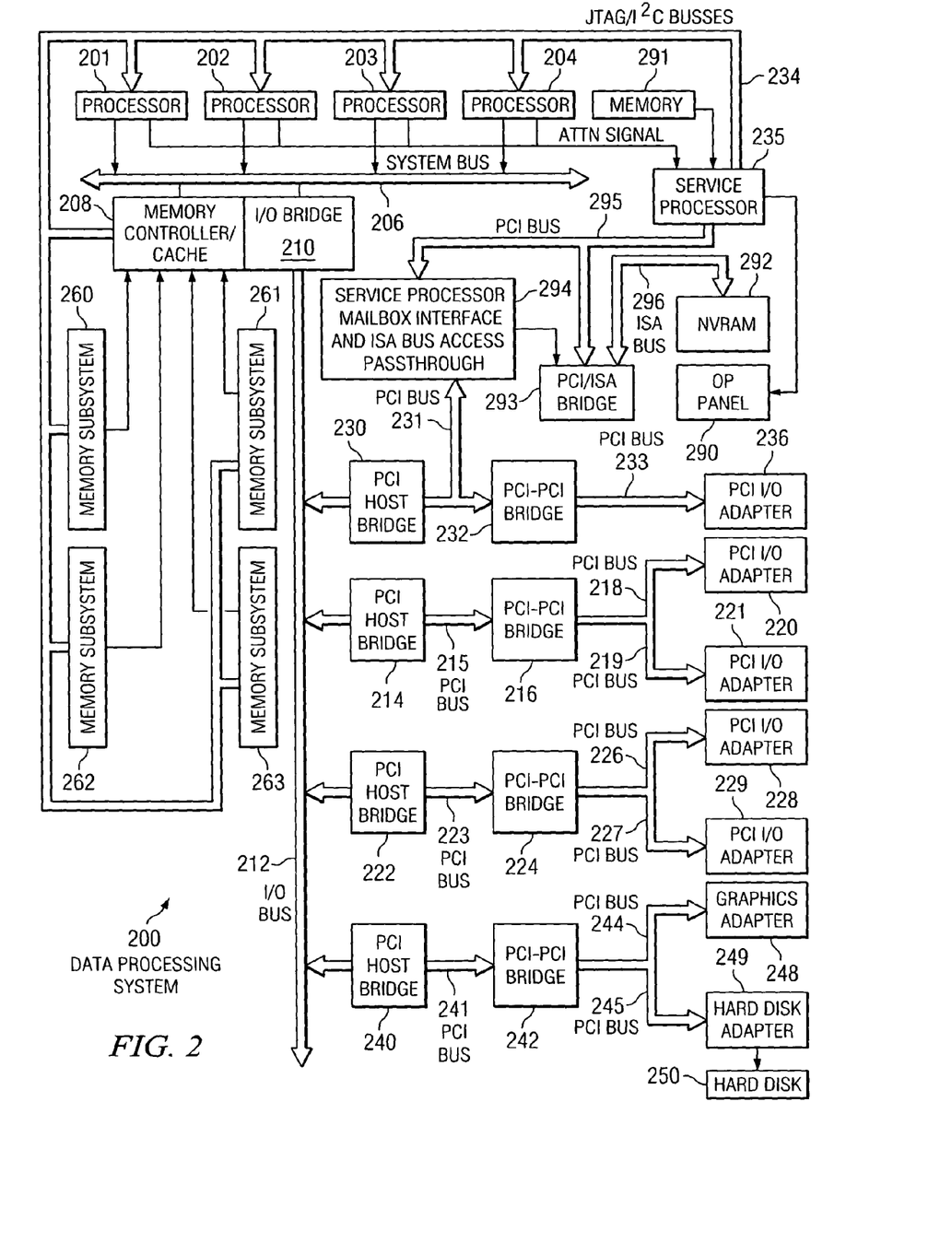
FIG. 2 is a detailed block diagram of a data processing system in which the present invention may be implemented in accordance with the present invention.

FIG. 2 illustrates a detailed block diagram of a data processing system in which the present invention may be implemented. Data processing system 200 may be a symmetric multiprocessor (SMP) system including a plurality of processors 201, 202, 203, and 204 connected to system bus 206. For example, data processing system 200 may be an IBM RS/6000, a product of International Business Machines Corporation in Armonk, N.Y., implemented as a server within a network. Alternatively, a single processor system may be employed. Also connected to system bus 206 is memory controller/cache 208, which provides an interface to a plurality of memory subsystems 260-263. I/O bus bridge 210 is connected to system bus 206 and provides an interface to I/O bus 212. Memory controller/cache 208 and I/O bus bridge 210 may be integrated as depicted.

As used herein, a memory subsystem includes a memory card to which are attached physical memory modules such as DIMMs. A memory card also includes one or more buffers as described herein which may act as virtual DIMMs. Each buffer is assigned a unique identifier and is coupled to the data and address buses of the memory card. Each buffer is also coupled to a processor, such as service processor 235, utilizing a bus, such as JTAG bus 234. In this manner, service processor 235 may control the buffers and may write data to and read data from the buffers.

Data processing system 200 may be a logically partitioned data processing system. Thus, data processing system 200 may have multiple heterogeneous operating systems (or multiple instances of a single operating system) running simultaneously. Each of these multiple operating systems may have any number of software programs executing within it. Data processing system 200 may be logically partitioned such that different I/O adapters 220-221, 228-229, 236, and 248-249 may be assigned to different logical partitions.

Peripheral component interconnect (PCI) Host bridge 214 connected to I/O bus 212 provides an interface to PCI local bus 215. A number of Input/Output adapters 220-221 may be connected to PCI bus 215 through PCI to PCI bridge 216. Typical PCI bus implementations will support between four and eight I/O adapters (i.e. expansion slots for add-in connectors). Each I/O Adapter 220-221 provides an interface between data processing system 200 and input/output devices such as, for example, other network computers, which are clients to data processing system 200.

An additional PCI host bridge 222 provides an interface for an additional PCI bus 223. PCI bus 223 is connected to a plurality of PCI I/O adapters 228-229 by a PCI bus 226-227. Thus, additional I/O devices, such as, for example, modems or network adapters may be supported through each of PCI I/O adapters 228-229. In this manner, data processing system 200 allows connections to multiple network computers.

A memory mapped graphics adapter 248 may be connected to I/O bus 212 through PCI Host Bridge 240 and PCI-PCI bridge 242 via PCI buses 244 and 245 as depicted. Also, a hard disk 250 may also be connected to I/O bus 212 through PCI Host Bridge 240 and PCI-PCI bridge 242 via PCI buses 241 and 245 as depicted.

A PCI host bridge 230 provides an interface for a PCI bus 231 to connect to I/O bus 212. PCI bus 231 connects PCI host bridge 230 to the service processor mailbox interface and ISA bus accesses pass-through logic 294 and PCI-PCI bridge 232. The ISA bus accesses pass-through logic 294 and forwards PCI accesses destined to the PCI/ISA bridge 293. The NVRAM storage is connected to the ISA bus 296. The service processor 235 is coupled to the service processor mailbox interface 294 through its local PCI bus 295. Service processor 235 is also connected to processors 201-204 via a plurality of JTAG/I$^2$C buses 234. JTAG/I$^2$C buses 234 are a combination of JTAG/scan busses (see IEEE 1149.1) and Phillips I$^2$C busses. However, alternatively, JTAG/I$^2$C buses 234 may be replaced by only Phillips I$^2$C busses or only JTAG/scan busses. All SP-ATTN signals of the host processors 201, 202, 203, and 204 are connected together to an interrupt input signal of the service processor. The service processor 235 has its own local memory 291, and has access to the hardware operator control panel 290.

When data processing system 200 is initially powered up, service processor 235 uses the JTAG/scan buses 234 to interrogate the system (Host) processors 201-204, memory controller 208, and I/O bridge 210. At completion of this step, service processor 235 has an inventory and topology understanding of data processing system 200. Service processor 235 also executes Built-In-Self-Tests (BISTs), Basic Assurance Tests (BATs), and memory tests on all elements found by interrogating the system processors 201-204, memory controller 208, and I/O bridge 210. Any error information for failures detected during the BISTs, BATs, and memory tests are gathered and reported by service processor 235.

The JTAG bus may be extended to one or all memory subsystems, such as memory subsystems 260-263, and to memory controller 208.

Those of ordinary skill in the art will appreciate that the hardware depicted in FIG. 2 may vary. For example, other peripheral devices, such as optical disk drives and the like, also may be used in addition to or in place of the hardware depicted. The depicted example is not meant to imply architectural limitations with respect to the present invention.

Figure 3A:
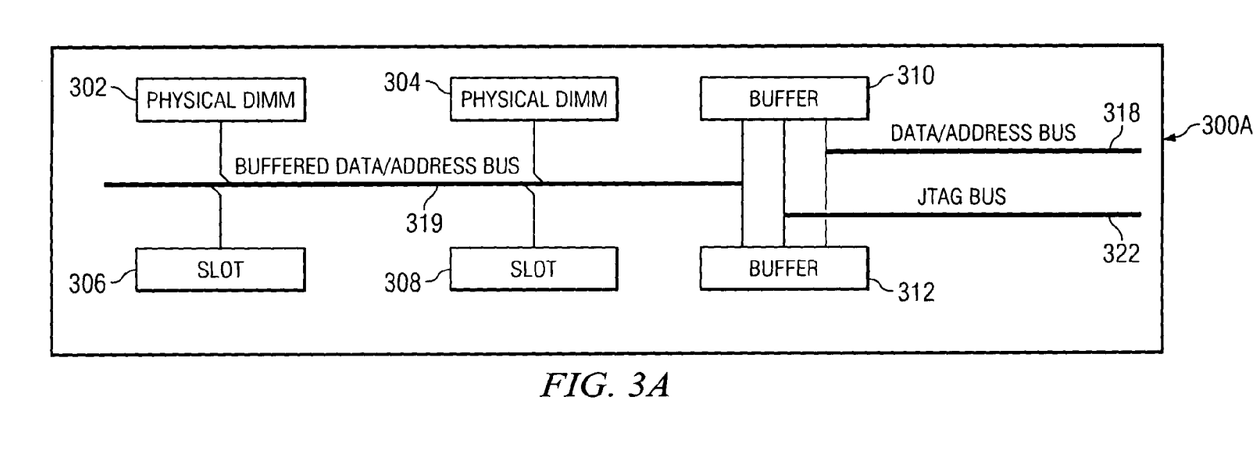
FIG. 3A is a block diagram of a memory subsystem that includes a memory card, physical memory modules, and buffers in accordance with the present invention.

FIG. 3A is a block diagram of a memory subsystem that includes a memory card, physical memory modules, and buffers in accordance with the present invention. The memory card 300a includes one or more physical memory modules, such as memory modules 302 and 304. Memory card 300a may include additional empty slots 306 and 308 for attaching additional physical memory modules to memory card 300a.

Typical memory cards also include one or more buffers, such as buffers 310 and 312. According to the present invention buffers 310 and 312 are coupled to a bus, such as JTAG bus 322, for communicating with a processor, such as service processor 235. Buffers may be written to and read from using data/address bus 318. Memory modules 302 and 304 are on the buffered data/address bus 319 which goes into buffers 310 and 312.

Testing a memory system utilizing the existing electrical buffers 310 and 312 on the memory card as virtual memory elements, such as a virtual memory controller, permits testing the memory system utilizing hardware that is already present on the card with minimal modifications. The buffers are modified, if necessary, to couple them to a bus such as the JTAG bus.

Figure 3B:
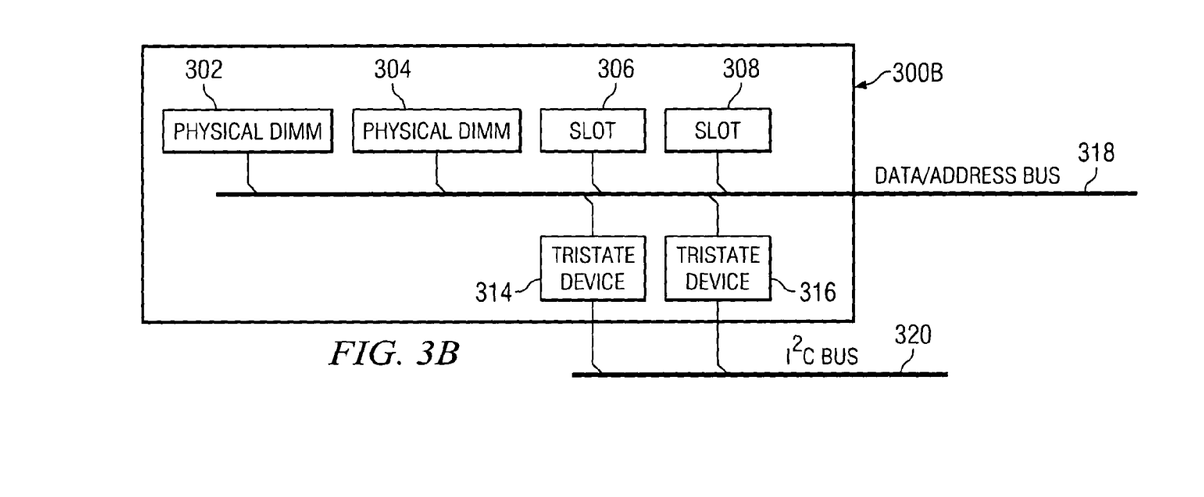
FIG. 3B is a block diagram of a memory subsystem that includes a memory card, physical memory modules, and tristate devices in accordance with the present invention.

FIG. 3B is a block diagram of a memory subsystem that includes a memory card, physical memory modules, and tristate devices in accordance with the present invention. A memory system may also be tested using tristate devices 314 and 316. Typical memory cards do not include tristate devices. Therefore, these devices may be added to a memory card. A processor may control devices 314 and 316 using a bus, such as I$^2$C bus 320. Each of devices 314 and 316 includes a parallel to serial register conversion function. There would be as many input lines on the parallel to serial register as there are address and data lines on the memory card. These tristate devices 314 and 316 are used in the same manner as the electrical buffers to test a memory system.

Using tristate devices to conduct the test will require additional hardware to be added to the memory card.

Figures 4, 5:
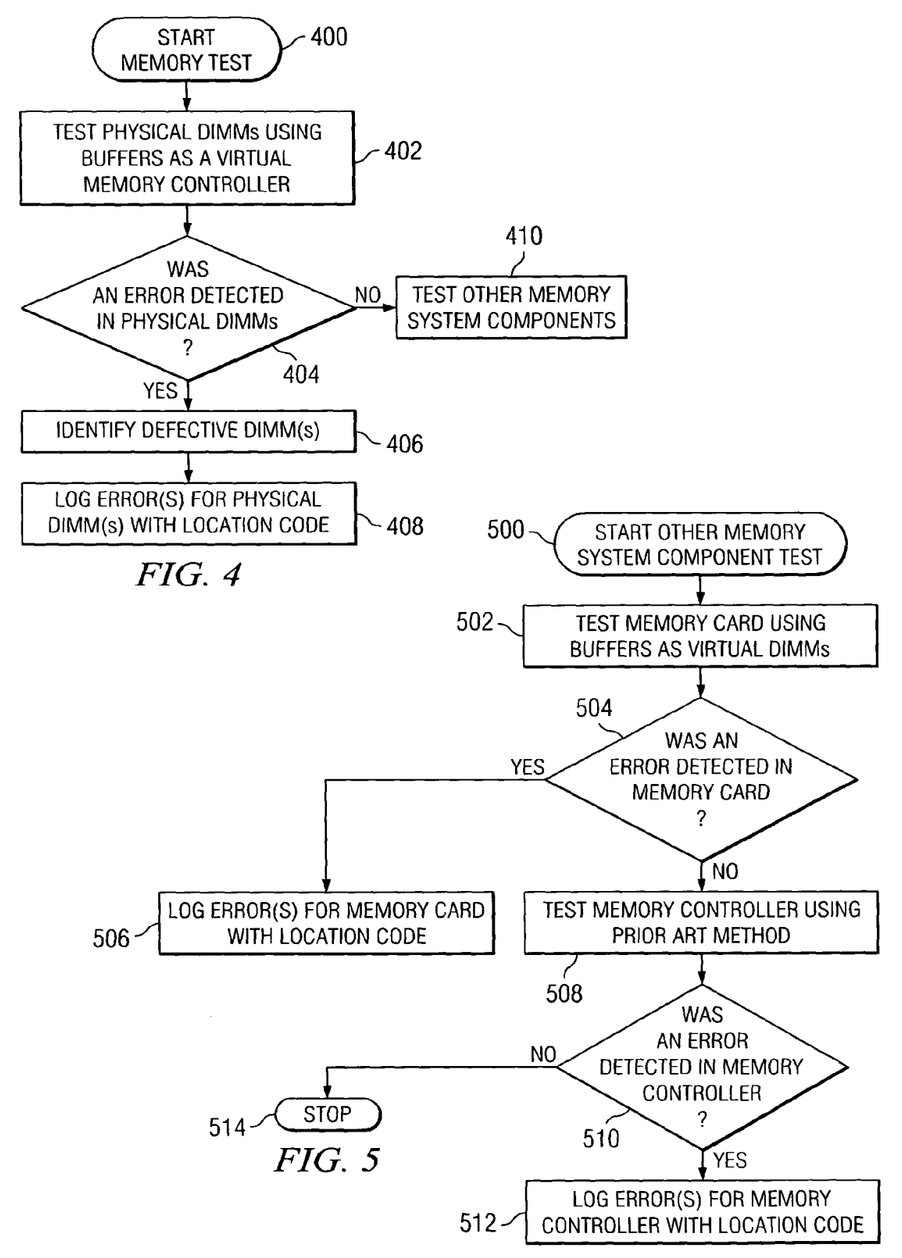
FIG. 4 depicts a high level flow chart which illustrates testing a memory system, by first testing physical memory modules and then other memory system components in accordance with the present invention.
FIG. 5 depicts a high level flow chart which illustrates testing other memory system components such as memory card and memory controller in accordance with the present invention.

FIG. 4 depicts a high level flow chart which illustrates testing a memory system in accordance with the present invention. The process starts as depicted by block 400 and thereafter passes to block 402 which illustrates testing each physical memory module (DIMM) of the memory system first. The process of testing physical memory modules in accordance with the present invention is depicted in more detail by FIG. 6.

Referring again to the present invention, the process passes to block 404 which illustrates a determination of whether or not an error was detected in one or more physical memory modules. If a determination is made an error was detected in one or more physical memory modules, the process passes to block 406 which illustrates identifying the defective one or more physical memory modules. Thereafter, block 408 depicts logging the error(s) for the physical memory module(s) with the appropriate location code. Referring again to block 404, if a determination is made that no error was detected in any of the physical modules, the process passes to block 410 which illustrates testing other memory system components such as the memory card and the memory controller. The process of block 410 is depicted in more detail by FIG. 5.

FIG. 5 illustrates a high level flow chart which depicts testing other memory system components in accordance with the present invention. The process starts as depicted by block 500 which illustrates starting a test for other memory system components such as a memory card and a memory controller. If the entire memory system includes more than one such memory component, the process illustrated by FIG. 5 is repeated for each component.

The process then passes to block 502 which depicts testing a memory card using electrical buffers that are already included as part of a typical memory card. These buffers are used as virtual memory modules. Alternatively, the memory card may be tested utilizing tristate devices that have been added to the memory card. A more detailed description of the memory card testing process is described with reference to FIG. 7.

Thereafter, block 504 illustrates a determination of whether or not an error was detected in the memory card. If a determination is made that an error was detected, the process passes to block 506 which depicts logging the error(s) for the memory card with the appropriate location code. Referring again to block 504, if a determination is made that no error was detected in the memory card, the process passes to block 508 which illustrates testing the memory controller using a prior art method. A more detailed description of the memory controller testing process is described with reference to FIG. 8.

Referring again to the present invention, block 510, then, depicts a determination of whether or not an error was detected in the memory controller. If a determination is made that an error was detected in the memory controller, the process passes to block 512 which illustrates logging the error(s) for the memory controller with the appropriate location code. Referring again to block 510, if a determination is made that no error was detected, the process terminates as depicted by block 514.

Figure 6:
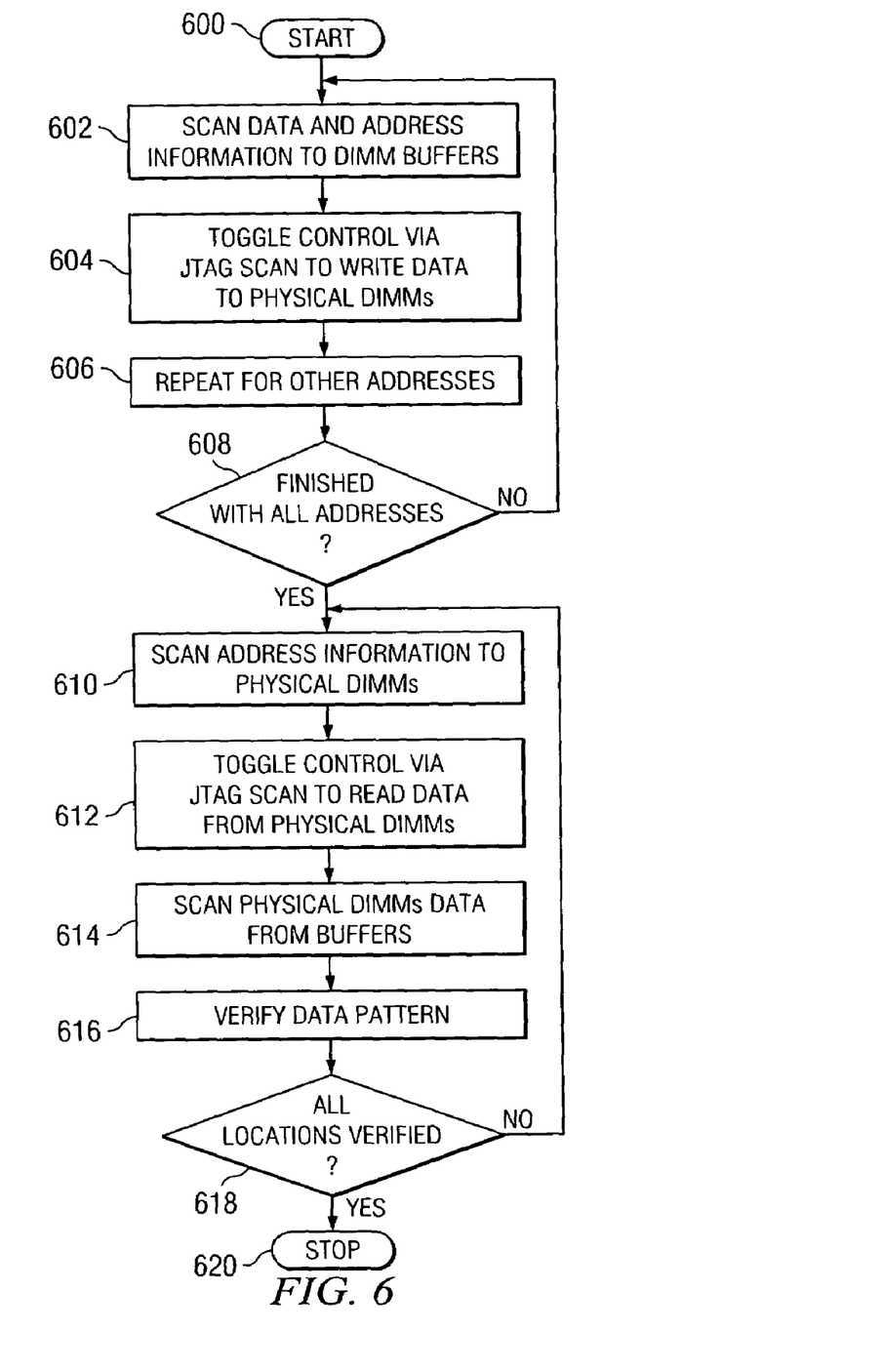
FIG. 6 depicts a high level flow chart which illustrates testing physical memory modules (physical DIMMs) in accordance with the present invention.

FIG. 6 depicts a high level flow chart which illustrates testing a physical memory module in accordance with the present invention. If there are multiple physical memory modules (DIMMs) in the system, this process is repeated for each module. The process for testing physical memory modules starts as depicted by block 600. Physical memory modules are accessed via the memory card electrical buffers using the JTAG bus. Thus, the buffers are treated as a virtual memory controller. A test pattern is setup to test the physical memory modules. Next, block 602 depicts scanning data and address information to these buffers. Block 604, then, depicts toggling control via JTAG scan to write data to physical memory modules using the buffers. Next, block 606 depicts repeating the same process for other addresses within the physical memory module. Block 608 illustrates a determination of whether or not all addresses within the physical memory module have been written to. If a determination is made that there are additional addresses to write to, the process passes back to block 602. Referring again to block 608, if data has been written to all addresses, the process passes to block 610.

Block 610 depicts scanning address information to the physical memory modules. Thereafter, block 612 illustrates toggling control via JTAG scan to read data from the physical memory modules. Next, block 614 depicts scanning the physical memory module data from the buffers. Block 616, then, illustrates a verification of the data pattern to ensure that what was written is read back. Next, block 618 illustrates a determination of whether all the memory locations were verified. If not, the process passes back to block 610. If all the memory locations were verified, then the process terminates as depicted by block 620. As described above, tristate devices may be used instead of the buffers to test the physical memory modules.

Figure 7:
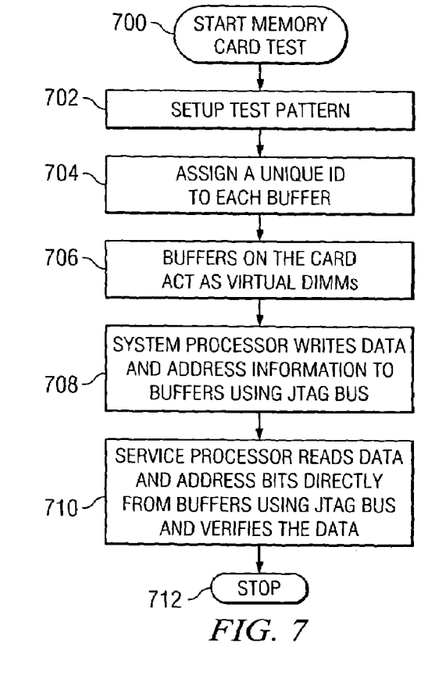
FIG. 7 depicts a high level flow chart which illustrates testing a memory card in accordance with the present invention.

FIG. 7 depicts a high level flow chart which illustrates testing a memory card in accordance with the present invention. The process for testing a memory card starts as depicted by block 700. Next, block 702 depicts setting up a test pattern to test a memory card. The process then passes to block 704 which illustrates assigning a unique identifier to each buffer. Next, block 706 depicts treating electrical buffers on the memory card as virtual memory modules. Next, block 708 depicts the system processor writing data and address information directly to each buffer by writing data and address bits to the memory subsystem. Block 710, then, illustrates the service processor reading the data and address information back directly from the buffers using the JTAG bus. The process then terminates as depicted by block 712. As described above, the tristate devices instead of the buffers may be used to test a memory card.

Figure 8:
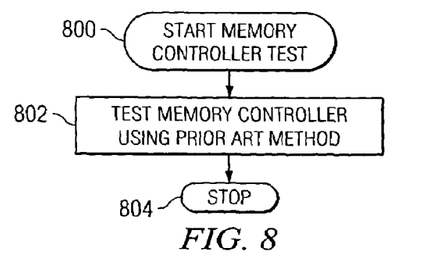
FIG. 8 depicts a high level flow chart which illustrates testing a memory controller using any of the prior art methods in accordance with the present invention.

FIG. 8 illustrates a high level flow chart which illustrates testing a memory controller using a prior art method in accordance with the present invention. The process for testing a memory controller starts as depicted by block 800 and thereafter passes to block 802 which illustrates testing of a memory controller using any of the prior art methods such as Built In Self Test (BIST) or JTAG scan chain signature verification. The process then terminates as illustrated by block 804.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, and DVD-ROMs, The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for isolating a defect in a memory system, said method comprising the steps of:
    said memory system including a memory card, a plurality of physical dual inline memory modules (DIMMs) that are attached to said memory card, and a memory controller for controlling said memory card;
    said memory card coupled to said memory controller using a JTAG bus, said memory card including a plurality of empty slots to which additional physical DIMMs can be attached, and said memory card including a plurality of electrical buffers that are part of said memory card;
    testing said plurality of physical DIMMs first using a physical DIMM test;
    responsive to no error occurring during said physical DIMM test, testing said memory card using a memory card test;
    responsive to no error occurring during said memory card test, testing said memory controller next using a memory controller test;
    responsive to said memory controller passing said memory controller test, determining that said memory system is good;
    utilizing said plurality of electrical buffers as a virtual memory controller when testing said plurality of physical DIMMs, and utilizing said plurality of electrical buffers as virtual physical DIMMs when testing said memory card;
    coupling said plurality of electrical buffers to a service processor using a JTAG bus, said service processor controlling said plurality of electrical buffers using said JTAG bus;
    said physical DIMM test including:
        scanning DIMM test data and address information to said plurality of electrical buffers, which then scan said DIMM test data to all addresses in each one of said plurality of physical DIMMs;
        reading data from said plurality of physical DIMMs;
        scanning, from said plurality of electrical buffers, said data that was read from said plurality of physical DIMMs;
        determining that said plurality of physical DIMMs passed said physical DIMMs test if said data that was read from said plurality of physical DIMMs matches said DIMM test data;
    said memory card test including:
        assigning a unique identifier to each one of said plurality of electrical buffers, each one of said plurality of electrical buffers addressable by the service processor using said unique identifier;
        treating each one of said plurality of electrical buffers as a virtual physical DIMM;
        testing, by the service processor, data bits by writing card test data to each memory location in said virtual physical DIMM, and then reading data from each memory location in said virtual physical DIMM;
        if said data that was read from said virtual physical DIMM matches said card test data, performing address bit verification on said memory card;
        said address bit verification to test address bits including:
            writing a known test pattern to a first memory location that falls within a range of said virtual physical DIMM, and then reading a set of addresses that fall within said range of said virtual physical DIMM;
            determining whether said known test pattern was read from only said first memory location;
            if said known test pattern was read from only said first memory location: said service processor determining that said memory card passed said address bit verification for said first memory location, removing said known test pattern from said first memory location, and performing said address bit verification on a next memory location; and
            if all memory locations that fall within said range pass said address bit verification, determining that said memory card passed said memory card test.

2. The method according to claim 1, further comprising the steps of:
    storing a controller data pattern in said memory controller;
    reading a data pattern from said memory controller;
    comparing said controller data pattern to said data pattern that was read from said memory controller;
    determining that said memory controller passed said test in response to said controller data pattern being the same as said data pattern that was read from said memory controller; and
    determining that said memory controller failed said memory controller test in response to said controller data pattern being different from said data pattern that was read from said memory controller.

3. The method according to claim 2, further comprising the steps of:
    coupling said memory controller to a service processor.

4. The method according to claim 2, further comprising the steps of:
    coupling said memory controller to a service processor utilizing a JTAG bus.

5. A data processing system for isolating a defect in a memory system to a particular memory system component, said system comprising:
    said memory system including a memory card, a plurality of physical dual inline memory modules (DIMMs) that are attached to said memory card, and a memory controller for controlling said memory card;
    said memory card coupled to said memory controller using a JTAG bus, said memory card including a plurality of empty slots to which additional physical DIMMs can be attached, and said memory card including a plurality of electrical buffers that are part of said memory card;
    testing means for testing said plurality of physical DIMMs first using a physical DIMM test;
    responsive to no error occurring during said physical DIMM test, testing means for testing said memory card using a memory card test;
    responsive to no error occurring during said memory card test, testing means for testing said memory controller next using a memory controller test;

responsive to said memory controller passing said memory controller test, determining means for determining that said memory system is good;

said plurality of electrical buffers utilized as a virtual memory controller when testing said plurality of physical DIMMs, and said plurality of electrical buffers utilized as virtual physical DIMMs when testing said memory card;

coupling said plurality of electrical buffers to a service processor using a JTAG bus, said service processor controlling said plurality of electrical buffers using said JTAG bus;

said physical DIMM test including:

scanning means for scanning DIMM test data and address information to said plurality of electrical buffers, which then scan said DIMM test data to all addresses in each one of said plurality of physical DIMMs;

reading means for reading data from said plurality of physical DIMMs;

scanning means for scanning, from said plurality of electrical buffers, said data that was read from said plurality of physical DIMMs;

determining means for determining that said plurality of physical DIMMs passed said physical DIMM test if said data that was read from said plurality of physical DIMMs matches said DIMM test data;

said memory card test including:

a unique identifier assigned to each one of said plurality of electrical buffers, each one of said plurality of electrical buffers addressable by the service processor using said unique identifier;

each one of said plurality of electrical buffers treated as a virtual physical DIMM;

the service processor testing data bits by writing card test data to each memory location in said virtual physical DIMM, and then reading data from each memory location in said virtual physical DIMM;

if said data that was read from said virtual physical DIMM matches said card test data, performing means for performing address bit verification on said memory card;

said address bit verification to test address bits including:

writing means for writing a known test pattern to a first memory location that falls within a range of said virtual physical DIMM, and then reading means for reading a set of addresses that fall within said range of said virtual physical DIMM;

determining means for determining whether said known test pattern was read from only said first memory location;

if said known test pattern was read from only said first memory location: said service processor determining that said memory card passed said address bit verification for said first memory location, removing said known test pattern from said first memory location, and performing said address bit verification on a next memory location; and if all memory locations that fall within said range pass said address bit verification, determining means for determining that said memory card passed said memory card test.

6. The system according to claim 5, further comprising:
storing means for storing a controller data pattern in said memory controller;

reading means for reading a data pattern from said memory controller;

comparing means for comparing said controller data pattern to said data pattern that was read from said memory controller;

determining means for determining that said memory controller passed said test in response to said controller data pattern written to said memory controller being the same as said data pattern that was read from said memory controller; and determining means for determining that said memory controller failed said memory controller test in response to said controller data pattern written to said memory controller being different from said data pattern that was read from said memory controller.

7. The system according to claim 6, further comprising:
said memory controller being coupled to a service processor utilizing a JTAG bus.

8. A computer program product that is stored on a tangible computer readable medium in a data processing system for isolating a defect in a memory system to a particular memory system component, said product comprising:

said memory card coupled to said memory controller using a JTAG bus, said memory card including a plurality of empty slots to which additional physical DIMMs can be attached, and said memory card including a plurality of electrical buffers that are part of said memory card;

instructions for testing said plurality of physical DIMMs first using a physical DIMM test;

responsive to no error occurring during said physical DIMM test, instructions for testing said memory card using a memory card test;

responsive to no error occurring during said memory card test, instructions for testing said memory controller next using a memory controller test;

responsive to said memory controller passing said memory controller test, instructions for determining that said memory system is good;

instructions for utilizing said plurality of electrical buffers as a virtual memory controller when testing said plurality of physical DIMMs, and utilizing said plurality of electrical buffers as virtual physical DIMMs when testing said memory card;

coupling said plurality of electrical buffers to a service processor using a JTAG bus, said service processor controlling said plurality of electrical buffers using said JTAG bus;

said physical DIMMs test including:

instructions for scanning DIMMs test data and address information to said plurality of electrical buffers, which then scan said DIMMs test data to all addresses in each one of said plurality of physical DIMMs;

instructions for reading data from said plurality of physical DIMMs:

instructions for scanning, from said plurality of electrical buffers, said data that was read from said plurality of physical DIMMs;

instructions for determining that said plurality of physical DIMMs passed said physical DIMMs test if said data that was read from said plurality of physical DIMMs matches said DIMMs test data;

said memory card test including:

instructions for assigning a unique identifier to each one of said plurality of electrical buffers, each one of said plurality of electrical buffers addressable by the service processor using said unique identifier;

instructions for treating each one of said plurality of electrical buffers as a virtual physical DIMM;

instructions for testing, by the service processor, data bits by writing card test data to each memory location in said virtual physical DIMM, and then reading data from each memory location in said virtual physical DIMM;

if said data that was read from said virtual physical DIMM matches said card test data, instructions for performing address bit verification on said memory card;

said address bit verification to test address bits including:

instructions for writing a known test pattern to a first memory location that falls within a range of said virtual physical DIMM, and then reading a set of addresses that fall within said range of said virtual physical DIMM;

instructions for determining whether said known test pattern was read from only said first memory location;

if said known test pattern was read from only said first memory location: said service processor determining that said memory card passed said address bit verification for said first memory location, removing said known test pattern from said first memory location, and performing said address bit verification on a next memory location; and if all memory locations that fall within said range pass said address bit verification, instructions for determining that said memory card passed said memory card test.

\* \* \* \* \*